(12) United States Patent
Kato et al.

(10) Patent No.: US 6,558,783 B1
(45) Date of Patent: May 6, 2003

(54) THERMOSETTING POLYPHENYLENE ETHER RESIN COMPOSITION, CURED RESIN COMPOSITION OBTAINED THEREFROM, AND LAMINATED STRUCTURE

(75) Inventors: Akihiro Kato, Yokohama (JP); Shozo Kinoshita, Fuji (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 09/582,526

(22) PCT Filed: Feb. 23, 1999

(86) PCT No.: PCT/JP99/00813

§ 371 (c)(1),
(2), (4) Date: Jun. 28, 2000

(87) PCT Pub. No.: WO99/42523

PCT Pub. Date: Aug. 26, 1999

(30) Foreign Application Priority Data

Feb. 23, 1998 (JP) ............................................. 10-055716
Oct. 29, 1998 (JP) ............................................. 10-308108

(51) Int. Cl.[7] ......................... B32B 27/04; B32B 15/08
(52) U.S. Cl. ................................ 428/297.4; 428/301.4; 428/413; 428/414; 428/416; 428/418; 428/457; 428/460; 442/23; 442/43; 442/45; 442/58; 442/233; 525/534
(58) Field of Search ......................... 525/534; 428/457, 428/413, 414, 416, 418, 460, 297.4, 464, 301.4; 442/43, 58, 23, 45, 233

(56) References Cited

U.S. PATENT DOCUMENTS

| | | | |
|---|---|---|---|
| 5,001,010 A | | 3/1991 | Chao et al. ................. 428/417 |
| 5,834,565 A | * | 11/1998 | Tracy et al. ................. 525/391 |
| 5,945,222 A | * | 8/1999 | Nagase et al. ............... 428/416 |
| 6,207,786 B1 | * | 3/2001 | Ishida et al. ................. 528/94 |

FOREIGN PATENT DOCUMENTS

| | | |
|---|---|---|
| EP | 0875531 A2 | 11/1998 |
| JP | 07329087 A | 12/1995 |
| JP | 09001728 A | 1/1997 |
| JP | 09246429 A | 9/1997 |
| JP | 10025343 A | 1/1998 |
| JP | 10060371 A | 3/1998 |

* cited by examiner

Primary Examiner—Paul Thibodeau
Assistant Examiner—Monique R. Jackson
(74) Attorney, Agent, or Firm—Birch, Stewart, Kolasch & Birch, LLP

(57) ABSTRACT

Disclosed are a curable polyphenylene ether (PPE) resin composition comprising (a) a PPE resin and (b) a of a compound having a 3,4-dihydro-3-substituted-1,3-benzoxazine skeleton (DSBS compound), or a mixture of the DSBS compound and a ring-opening polymerization re-action product thereof; a cured PPE resin composition obtainable by curing the curable PPE resin composition; and a laminate structure obtained by using the curable or cured PPE resin composition. The curable PPE resin composition exhibits, after cured, excellent chemical resistance, moisture resistance, dielectric characteristics, heat resistance, flame retardancy and dimensional stability, so that it can be used as a dielectric, insulating or heat resistant material in the electrical, electronic, space and aircraft industries. Especially, it can be advantageously used as a resin composition for forming insulating layers, such as substrates for a single-sided, double-sided or multi-layer printed circuit board, a flexible printed circuit board and a semi-rigid circuit board, and a substrate for a structure having excellent heat removal characteristics.

16 Claims, No Drawings

THERMOSETTING POLYPHENYLENE ETHER RESIN COMPOSITION, CURED RESIN COMPOSITION OBTAINED THEREFROM, AND LAMINATED STRUCTURE

This application is the national phase under 35 U.S.C. §371 of PCT International Application No. PCT/JP99/00813 which has an International filing date of Feb. 23, 1999, which designated the United States of America.

BACKGROUND OF THE INVENTION

1. Field of the Invention

The present invention relates to a curable poly-phenylene ether resin composition, and a cured composition and a cured structure obtainable therefrom by curing (hereinafter, a polyphenylene ether is frequently referred to as a "PPE"). More particularly, the present invention is concerned with a curable polyphenylene ether resin composition comprising: (a) a polyphenylene ether resin; and (b) a compound having a 3,4-dihydro-3-substituted-1,3-benzoxazine skeleton (hereinafter, frequently referred to as a "DSBS compound"), or a mixture of the DSBS compound and a ring-opening polymerization reaction product thereof. The present invention is also concerned with a cured resin composition obtainable by curing the curable PPE resin composition, and a laminate structure obtainable therefrom. The curable PPE resin composition of the present invention exhibits, after cured, excellent chemical resistance, moisture resistance, dimensional stability, dieletric electric characteristics, heat resistance and flame retardancy, so that the curable PPE resin composition can be advantageously used as a dielectric material, an insulating material, a heat-resisting material and the like in the electrical and electronic industries, and also in the space and aircraft industries. Especially, the curable PPE resin composition of the present invention can be advantageously used as a resin composition forming insulating layers, such as substrates for a single-sided printed circuit board, a double-sided printed circuit board, a multi-layer printed circuit board, a flexible printed circuit board and a semi-rigid circuit board, and a substrate for a structure having excellent heat removal characteristics.

2. Prior Art

In recent years, electronic components used in various fields, such as communication, household and industries, have been showing a great tendency toward miniaturization. For the purpose of miniaturization, the electronic components have been required to be mounted with high density packing. Accordingly, it has been strongly desired that materials for the electronic components should be excellent not only in heat resistance, flame retardancy, moisture resistance and dimensional stability, but also in electrical characteristics, such as electrical insulating characteristics and dielectric characteristics. For example, a copper-clad laminate made of a thermocurable resin, such as a phenol resin or an epoxy resin, has been used as a substrate for a printed circuit board. However, such a thermocurable resin used as a material for a copper-clad laminate, although having a good balance of various properties mentioned above, has problems in that the resin exhibits undesirable electrical characteristics. Specifically, such a resin exhibits a high dielectric constant and a high dielectric loss tangent in a high frequency range.

For solving the above-mentioned problems, polyphenylene ether resins have recently been expected to be new materials for electronic components, and various attempts have been made to use polyphenylene ether resins as materials for copper-clad laminates.

For example, Unexamined Japanese Patent Application Laid-Open Specification No. 61-287739 (corresponding to U.S. Pat. No. 5,124,415) discloses a laminate comprising an insulating layer and a metallic foil, wherein the insulating layer is obtained by curing a resin composition comprising a polyphenylene ether, and triallyl isocyanurate and/or triallyl cyanurate. However triallyl isocyanurate and/or triallyl cyanurate, which is used as a crosslinking agent, has neither satisfactory flame retardancy nor satisfactory moisture resistance. Therefore, when the above-mentioned laminate is used as a substrate for a printed circuit board, it is necessary to additionally use a chlorine-containing flame retardant and/or a bromine-containing flame retardant, or an auxiliary flame retardant, such as $Sb_2O_3$, $Sb_2O_5$, or $NaSbO_3.1/4H_2O$, so as to improve the flame retardancy of the laminate. However, it has recently been revealed that the use of halogen-containing flame retardants, such as a chlorine-containing retardant and a bromine-containing flame retardant, has a problem in that the combustion of a material containing a halogen-containing flame retardant is accompanied by the generation of toxic gas. Moreover, for solving the problem of poor moisture resistance, it is required to lower the hygroscopicity of the laminate.

Unexamined Japanese Patent Application Laid-Open Specification Nos. 2-55721 and 2-55722 (corresponding to U.S. Pat. Nos. 4,853,423 and 5,073,605, respectively) disclose thermocurable resin compositions comprising a polyphenylene ether, various epoxy resins and the like. Specifically, Unexamined Japanese Patent Application Laid-Open Specification No. 2-55721 discloses a resin composition comprising: (i) a product obtained by reacting bisphenol glycidyl ether, an epoxidated novolak and brominated bisphenol; (ii) a polyphenylene ether; (iii) a novolak resin; (iv) imidazole and poly-amines; (v) a zinc salt; and (vi) $Sb_2O_5$ and the like. Unexamined Japanese Patent Application Laid-Open Specification No. 2-55722 discloses a resin composition comprising: (i) bisphenol glycidyl ether, (ii) an epoxidated novolak and (iii) a bromine-containing polyphenylene ether. These resin compositions disclosed in Unexamined Japanese Patent Application Laid-Open Specification Nos. 2-55721 and 2-55722 respectively contain a combination of a bromine-containing flame retardant and $Sb_2O_5$, and a bromine-containing flame retardant, so that these resin compositions exhibit flame retardancy. However, as mentioned above, a bromine-containing flame retardant has a problem in that the combustion of a material containing a bromine-containing flame retardant is accompanied by the generation of toxic gas.

On the other hand, a compound having a 3,4-dihydro-3-substituted-1,3-benzoxazine skeleton (DSBS compound) is disclosed in each of U.S. Pat. No. 5,152,939 and Unexamined Japanese Patent Application Laid-Open Specification No. 9-157456. Specifically, U.S. Pat. No. 5,152,939 discloses that a DSBS compound is caused by heating to form therein a crosslinked mesh structure by a ring-opening polymerization reaction. Unexamined Japanese Patent Application Laid-Open Specification No. 9-157456 discloses a thermocurable resin composition comprising a compound having a 1,3-benzoxazine ring and an epoxy resin. However, the resin composition has low moisture resistance. Further, since the flame retardancy of the resin composition is given by a halogen moiety introduced into an epoxy resin skeleton in the resin composition, the resin composition is likely to cause an environmental pollution due to the generation of toxic gas, as mentioned above.

SUMMARY OF THE INVENTION

In this situation, the present inventors have made extensive and intensive studies with a view toward developing a curable resin composition which is free from the above-mentioned problems accompanying the conventional curable resin compositions, which has excellent dielectric characteristics inherently possessed by a polyphenylene ether and which is not only inexpensive but also simultaneously exhibits, even after cured, excellent flame retardancy, chemical resistance, moisture resistance, dimensional stability, heat resistance and dielectric characteristics. As a result, it has unexpectedly been found that the desired curable resin composition having not only excellent curability but also excellent flame retardancy, chemical resistance, moisture resistance, dimensional stability, heat resistance and dielectric characteristics can be realized by a curable polyphenylene ether resin composition comprising (a) a specific amount of a polyphenylene ether resin; and (b) a specific amount of a compound having a 3,4-dihydro-3-substituted-1,3-benzoxazine skeleton (DSBS compound), or of a mixture of the DSBS compound and ring-opening polymerization reaction product thereof. Based on this novel finding, the present invention has been completed.

Accordingly, it is a primary object of the present invention to provide a curable polyphenylene ether resin composition which is inexpensive and which not only has excellent dielectric characteristics inherently possessed by a polyphenylene ether, but also exhibits, even after cured, excellent flame retardancy, chemical resistance, moisture resistance, dimensional stability, heat resistance and dielectric characteristics, as well as excellent curability.

It is another object of the present invention to provide a laminate structure obtained by laminating the above-mentioned curable resin composition and a metallic foil and/or a metallic substrate, which can be advantageously used as a dielectric material, an insulating material, a heat resistant material and the like in the electrical and electronic industries, the space and aircraft industries and the like.

DETAILED DESCRIPTION OF THE INVENTION

According to the present invention, there is provided a curable polyphenylene ether resin composition comprising:
(a) a polyphenylene ether resin; and
(b) a compound having a 3,4-dihydro-3-substituted-1,3-benzoxazine skeleton (DSBS compound), or a mixture of the DSBS compound and a ring-opening polymerization reaction product thereof, and
wherein the amounts of components (a) and (b) are, respectively, from 98 to 20 parts by weight and from 2 to 80 parts by weight, relative to 100 parts by weight of the total of components (a) and (b).

For an easy understanding of the present invention, the essential features and various preferred embodiments of the present invention are enumerated below.

1. A curable polyphenylene ether resin composition comprising:
   (a) a polyphenylene ether resin; and
   (b) a compound having a 3,4-dihydro-3-substituted-1,3-benzoxazine skeleton (DSBS compound), or a mixture of the DSBS compound and a ring-opening polymerization product thereof, and
   wherein the amounts of polyphenylene ether resin (a) and component (b) are, respectively, from 98 to 20 parts by weight and from 2 to 80 parts by weight, relative to 100 parts by weight of the total of components (a) and (b).

2. The curable polyphenylene ether resin composition according to item 1 above, which further comprises a thermocurable resin (c), and wherein the total amount of components (a) and (b) and the amount of thermocurable resin (c) are, respectively, from 99 to 1 parts by weight and from 1 to 99 parts by weight, relative to 100 parts by weight of the total of components (a), (b) and (c).

3. The curable polyphenylene ether resin composition according to item 1 or 2 above, which is a film.

4. A cured polyphenylene ether resin composition obtainable by curing the curable polyphenylene ether resin composition of item 1 or 2 above.

5. The cured polyphenylene ether resin composition according to item 4 above, which is a film.

6. A curable polyphenylene ether resin composition composite material comprising:
   the curable polyphenylene ether resin composition of item 1 above; and
   (d) a reinforcement incorporated in the resin composition, and
   wherein the total amount of components (a) and (b) and the amount of component (d) are, respectively, from 95 to 10 parts by weight and from 5 to 90 parts by weight, relative to 100 parts by weight of the total of components (a), (b) and (d).

7. The curable polyphenylene ether resin composition composite material according to item 6 above, wherein the curable polyphenylene ether resin composition further comprises thermocurable resin (c), and
   wherein the total amount of components (a) and (b) and the amount of thermocurable resin (c) are, respectively from 99 to 1 parts by weight and from 1 to 99 parts by weight, relative to 100 parts by weight of the total of components (a), (b) and (c), and
   wherein the total amount of components (a), (b) and (c) and the amount of the component (d) are, respectively, from 95 to 10 parts by weight and from 5 to 90 parts by weight, relative to 100 parts by weight of the total of components (a), (b), (c) and (d).

8. A cured polyphenylene ether resin composition composite material obtainable by curing the curable polyphenylene ether resin composition composite material of item 6 or 7 above.

9. A curable laminate structure comprising a primary metallic foil and at least one curable resin composition layer disposed on at least one surface of the primary metallic foil,
   the curable resin composition layer comprising the curable polyphenylene ether resin composition of item 1 or 2 above or the curable polyphenylene ether resin composition composite material of item 6 or 7 above, with the proviso that when the laminate structure has at least two curable resin composition layers on at least one surface of the primary metallic foil, the at least two curable resin composition layers are the same or different and the at least two curable resin composition layers are disposed one upon another.

10. The curable laminate structure according to item 9 above, having an additional metallic foil disposed on the outer surface of the curable resin composition layer when the laminate structure has one curable resin composition layer on at least one surface of the primary metallic foil, and wherein, when the laminate structure has at least two curable resin composition layers on at least one surface of the primary metallic foil, the laminate structure has at least one structure selected from the group consisting of a metallic foil-exposed structure wherein there is an additional metallic foil disposed on the outer surface of an outermost curable resin composition layer and a metallic foil-interposed structure wherein there is an additional metallic foil disposed between at least one of the curable resin composition layers and a curable resin composition layer adjacent thereto.

11. A curable composite structure comprising a metallic substrate and at least one curable resin composition layer disposed on at least one surface of the metallic substrate, the curable resin composition layer comprising the curable polyphenylene ether resin composition of item 1 or 2 above or the curable polyphenylene ether resin composition composite material of item 6 or 7 above, with the proviso that when the composite structure has at least two curable resin composition layers on at least one surface of the metallic substrate, the at least two curable resin composition layers are the same or different and the at least two curable resin composition layers are disposed one upon another.

12. The curable composite structure according to item 11 above, having a metallic foil disposed on the outer surface of the curable resin composition layer when the composite structure has one curable resin composition layer on at least one surface of the metallic substrate, and wherein, when the composite structure has at least two curable resin composition layers on at least one surface of the metallic substrate, the composite structure has at least one structure selected from the group consisting of a metallic foil-exposed structure wherein there is a metallic foil disposed on the outer surface of an outermost curable resin composition layer and a metallic foil-interposed structure wherein there is a metallic foil disposed between at least one of the curable resin composition layers and a curable resin composition layer adjacent thereto.

13. A metallic foil/insulating layer laminate structure obtainable by curing the curable laminate structure of item 9 or 10 above.

14. A metallic substrate/insulating layer composite structure obtainable by curing the curable composite structure of item 11 or 12 above.

The curable PPE resin composition of the present invention comprising a polyphenylene ether resin and a DSBS compound in a specific ratio has various excellent properties, as compared to conventional curable resin compositions comprising a PPE resin and an epoxy resin.

A conventional curable PPE resin composition comprising a PPE resin and an epoxy resin has, after cured, unsatisfactory flame retardancy and unsatisfactory moisture resistance when it is used as a material for a substrate for a printed circuit board and the like. Therefore, for improving the flame retardancy of the conventional curable PPE resin compositions, it is necessary to incorporate into the composition a halogen-containing flame retardant or the like, although such a flame retardant adversely affects the environment. However, the curable PPE resin composition of the present invention comprising a PPE resin and a DSBS compound in a specific ratio is excellent not only in various properties, such as chemical resistance, moisture resistance, dimensional stability, heat resistance and dielectric characteristics, but also in flame retardancy, as compared to the conventional curable PPE resin composition comprising a PPE resin and an epoxy resin. Therefore, the curable PPE resin composition of the present invention can, without a need for such a halogen-containing flame retardant as adversely affects the environment, exhibit a high flame retardancy which is classified the level "V-0" in the test according JL-94. Also, even if a flame retardant is used in order to further enhance the flame retardancy of the curable PPE resin composition of the present invention, the amount of the flame retardant used can be lowered. Further, from the commercial point of view, the curable PPE resin composition of the present invention is advantageous in that the DSBS compound used in the curable PPE resin composition of the present invention is available at low cost.

Hereinbelow, the present invention is described in more detail.

The polyphenylene ether resin (PPE resin) used as component (a) of the curable resin composition of the present invention is represented by the following formula (I):
wherein:

m is an integer of from 1 to 6,

J is a polyphenylene ether chain comprising recurring units each represented by the following formula (II):

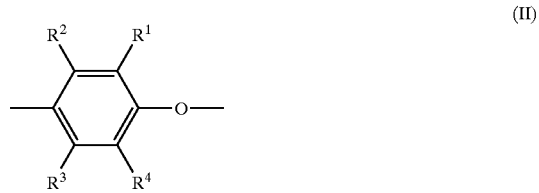

(II)

wherein each of $R^1$, $R^2$, $R^3$ and $R^4$ independently represents an alkyl group having 1 to 10 (preferably 1 to 5) carbon atoms, an aryl group, a haloalkyl group having 1 to 10 (preferably 1 to 5) carbon atoms, a halogen atom or a hydrogen atom, and Q represents a hydrogen atom when m is 1; and Q represents a residue of a multi-functional phenol compound having 2 to 6 phenolic hydroxyl groups and having unpolymerizable substituents at the ortho and para positions with respect to the phenolic hydroxyl groups when m is 2 or more.

As specific examples of $R^1$, $R^2$, $R^3$ and $R^4$ in formula (II) above, there can be mentioned the following groups or atoms. Specific examples of alkyl groups include a methyl group, an ethyl group, a n-propyl group, an isopropyl group, a n-butyl group, an isobutyl group and a sec-butyl group. Of these, a methyl group, an ethyl group, a n-propyl group and an n-butyl group are preferred, and a methyl group and an ethyl group are especially preferred. Specific examples of aryl groups include a phenyl group and a naphthyl group. Preferred examples of haloalkyl groups include a bromomethyl group and a chloromethyl group. Specific examples of halogen atoms include a bromine atom and a chlorine atom.

Representative examples of Q in formula (I) above wherein m is 2 or more include residues represented by the following four types of formulae:

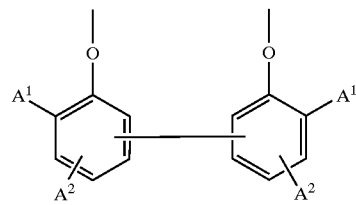

-continued

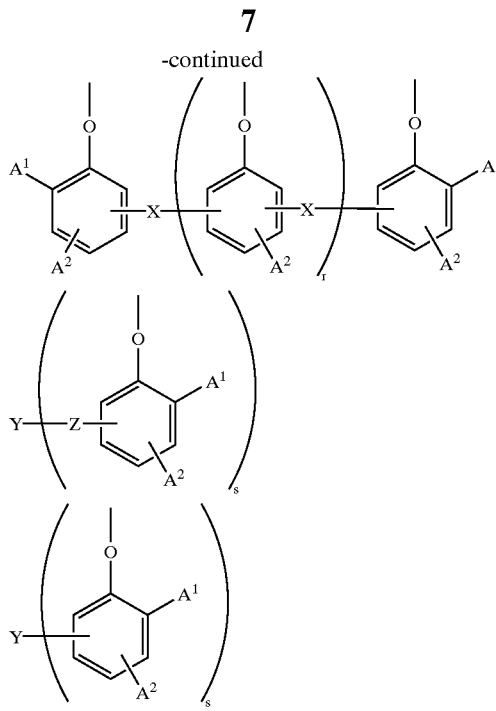

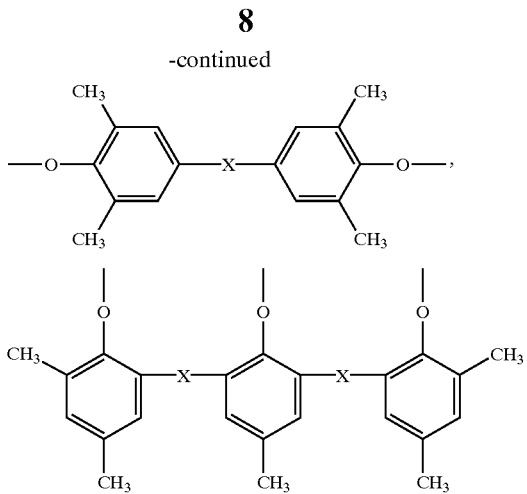

wherein each X independently represents —CH$_2$—, —C(CH$_3$)$_2$—, —O—, —S—, —SO$_2$—, or —CO—,

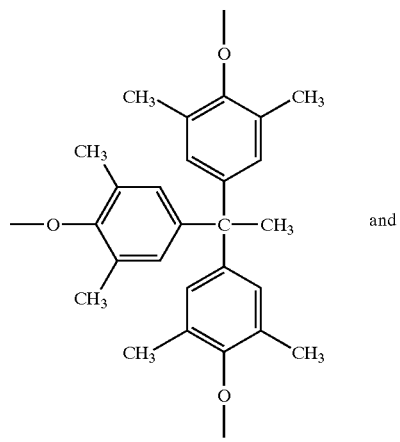 and

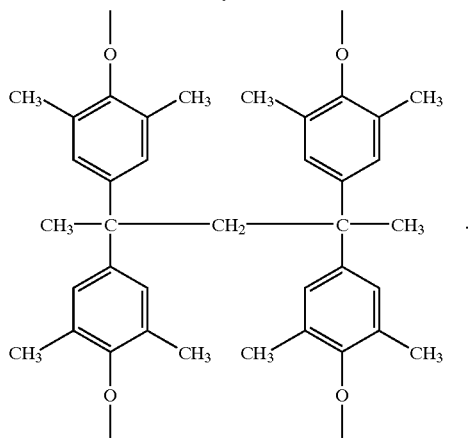

wherein:
- each of A$^1$ and A$^2$ independently represents a straight chain alkyl group having 1 to 4 carbon atoms,
- each X independently represents a divalent aliphatic hydrocarbon residue having 1 to 10 (preferably 1 to 5) carbon atoms which is unsubstituted or substituted with an aryl group, a halogen atom or the like; an oxygen atom; a sulfur atom; a sulfonyl group; or a carbonyl group,
- Y represents an s-valent aliphatic hydrocarbon residue or an s-valent aromatic hydrocarbon residue, each having 1 to 10 (preferably 1 to 5) hydrocarbon atoms and being unsubstituted or substituted with an aryl group, a halogen atom or the like,
- each Z independently represents an oxygen atom, a sulfur atom, a sulfonyl group or a carbonyl group,
- r is an integer of from 0 to 4, and
- s is an integer of from 2 to 6, with the proviso that:
  - each of A$^2$, X and Z is bonded directly to and Y is bonded directly or indirectly to the ortho or para position with respect to the oxygen atom shown in the formulae above, and
  - when directly to a first substituted phenoxy group is bonded the phenyl moiety of a second substituted phenoxy group, the phenyl moiety is bonded to the ortho or para position with respect to the oxygen atom shown in the formulae above.

Preferred examples of Q include residues represented by the following formulae:

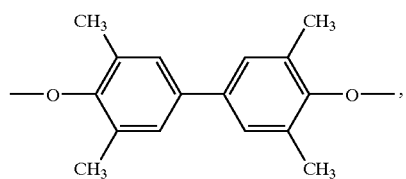

A polyphenylene ether chain represented by J in formula (I) above may, in addition to a unit represented by formula (II) above, contain a unit represented by the following formula (III), as long as the unit represented by formula (III) contained in the polyphenylene ether resin does not lower the heat resistance or thermal stability of the polyphenylene ether resin

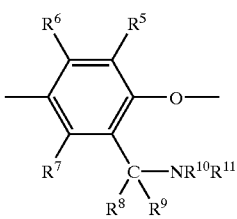

(III)

wherein:
each of $R^5$, $R^6$, $R^7$, $R^8$ and $R^9$ independently represents a hydrogen atom, a halogen atom, an alkyl group having 1 to 10 (preferably 1 to 5) carbon atoms, an aryl group, or a haloalkyl group 1 to 10 (preferably 1 to 5) carbon atoms, and each of $R^{10}$, $R^{11}$ independently represents a hydrogen atom; an alkyl group having 1 to 10 (preferably 1 to 5) carbon atoms which is unsubstituted or substituted with an aryl group, a halogen atom or the like; or an aryl group which is unsubstituted or substituted with an aryl group, a halogen atom or the like, with the proviso that $R^{10}$ and $R^{11}$ are not simultaneously hydrogen atoms.

Representative examples of units represented by formula (III) above include a unit represented by the following formula

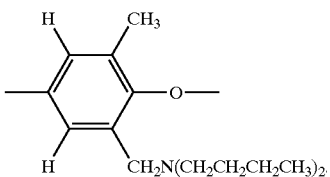

PPE resin (a) used in the present invention may contain a unit obtained by graft-polymerizing onto a unit represented by formula (II) or (III) above a polymerizable monomer having an unsaturated bond, such as styrene or methyl methacrylate.

Further, PPE resin (a) used in the present invention may contain a unit obtained by reacting an unsaturated carboxylic acid and/or an unsaturated acid anhydride with a unit represented by formula (II) or (III) above, wherein the obtained unit may or may not contain an unsaturated bond derived from at least one member selected from the group consisting of the unsaturated carboxylic acid and the unsaturated acid anhydride.

Examples of such unsaturated carboxylic acids and such unsaturated acid anhydrides include acrylic acid, methacrylic acid, maleic anhydride, fumaric acid, itaconic acid, itaconic anhydride, glutaconic anhydride and citraconic anhydride. The above-mentioned reaction of an unsaturated carboxylic acid or an unsaturated acid anhydride with a unit represented by formula (II) or (III) above is performed by heating the polyphenylene ether resin and an unsaturated carboxylic acid or an unsaturated acid anhydride at a temperature in the range of from 100 to 390° C., preferably from 260 to 360° C. The reaction may be performed in the presence of a free radical initiator. Any of two different methods, i.e., either a solution method or a melt-mixing method, can be employed for the reaction; however, the melt-mixing method, in which an extruder or the like is used, is easier to perform and is suitable for attaining the object of the present invention. The amount of an unsaturated carboxylic acid or an unsaturated acid anhydride used for the reaction is from 0.01 to 5.0 parts by weight, preferably from 0.1 to 3.0 parts by weight, relative to 100 parts by weight of the polyphenylene ether resin.

In the present invention, preferred examples of polyphenylene ether resins (a) represented by formula (I) above include: poly(2,6-dimethyl-1,4-phenylene ether) obtained by polymerizing 2,6-dimethylphenol; a styrene-grafted copolymer of poly(2,6-dimethyl-1,4-phenylene ether) and a reaction product thereof with maleic anhydride; a copolymer of 2,6-dimethylphenol and 2,3,6-trimethylphenol and a reaction product thereof with maleic anhydride; a copolymer of 2,6-dimethylphenol and 2,6-dimethyl-3-phenylphenol and a reaction product thereof with maleic anhydride; a multi-functional PPE resin obtained by polymerizing 2,6-dimethylphenol in the presence of a multi-functional phenol compound represented by the formula $Q\text{-(H)}_m$ wherein Q is as defined above for formula (I) and m is an integer of from 2 to 6; and a copolymer comprising units represented by formulae (II) and (III) above, such as a copolymer disclosed in Unexamined Japanese Patent Application Laid-Open Specification No. 63-301222 and a copolymer disclosed in Unexamined Japanese Patent Application Laid-Open Specification No. 1-297428.

In the present invention, it is preferred that the molecular weight of the PPE resin is such that the PPE resin has a reduced viscosity ($\eta$sp/C) in the range of from 0.1 to 1.0, as measured using a 0.5 g/dl chloroform solution thereof having a temperature of 30° C.

As component (b) of the curable PPE resin composition of the present invention, a compound having a 3-4-dihydro-3-substituted-1,3-benzoxazine skeleton (DSBS compound), or a mixture of the DSBS compound and a ring-opening polymerization reaction product thereof is used.

In the present invention, the term "DSBS compound" means not only a 3-4-dihydro-3-substituted-1,3-benzoxazine itself but also a compound having at least one 3-4-dihydro-3-substituted-1,3-benzoxazine skeleton. The 3-4-dihydro-3-substituted-1,3-benzoxazine skeleton may form a part of another skeleton in the DSBS compound.

A DSBS compound can be obtained by various methods. Examples of such methods include a method in which a DSBS compound is produced from a phenol, an amine and formaldehyde. As such phenols, a monohydric phenol and a polyhydric phenol can be used. As such amines, a monoamine and a polyamine can be used.

Specific examples of phenols which can be used for producing the DSBS compound in the present invention include: monohydric phenols, such as phenol, cresol, ethylphenol, naphthol, and anthrol; dihydric phenols, such as catechol, resorcinol, hydroquinone, bis(hydroxyphenyl) propane, dihydroxydiphenyl sulfone, bis(hydroxyphenyl) methane, and dihydroxybiphenyl; phenols having 3 or more hydroxyl groups, such as trihydroxynaphthalene, trihydroxyanthracene, a novolak resin, and a phenol resin (e.g., a resol resin).

Examples of amines which can be used for producing the DSBS compound in the present invention include: monoamines, such as aniline, methylamine and cyclohexylamine; diamines, such as p-phenylenediamine; and amines having 3 or more amino groups, such as triaminonaphthalene and triaminoanthracene.

With respect to the combination of the above-mentioned phenols and amines and formaldehyde, various combinations can be suitably selected depending on the use. However, it is preferred to select a combination such that the combination can produce a DSBS compound having a structural unit containing a plurality of benzoxazine skeletons, because the DSBS compound having such structural unit is effective for introducing a crosslinked structure into the DSBS compound. Examples of preferred combinations include a combination of a monohydric phenol, a diamine and formaldehyde, and a combination of a dihydric phenol, a monoamine and formaldehyde. Further, it is preferred to use an aromatic amine as the amine used in combination with a phenol and formaldehyde, since the use of the aromatic amine improves the flame retardancy of the curable PPE resin composition of the present invention. As an example of a synthesis reaction for producing a DSBS compound, there can be mentioned a synthesis reaction represented by the following reaction scheme (IV), in which a combination of a dihydric phenol, a monoamine and formaldehyde is used.

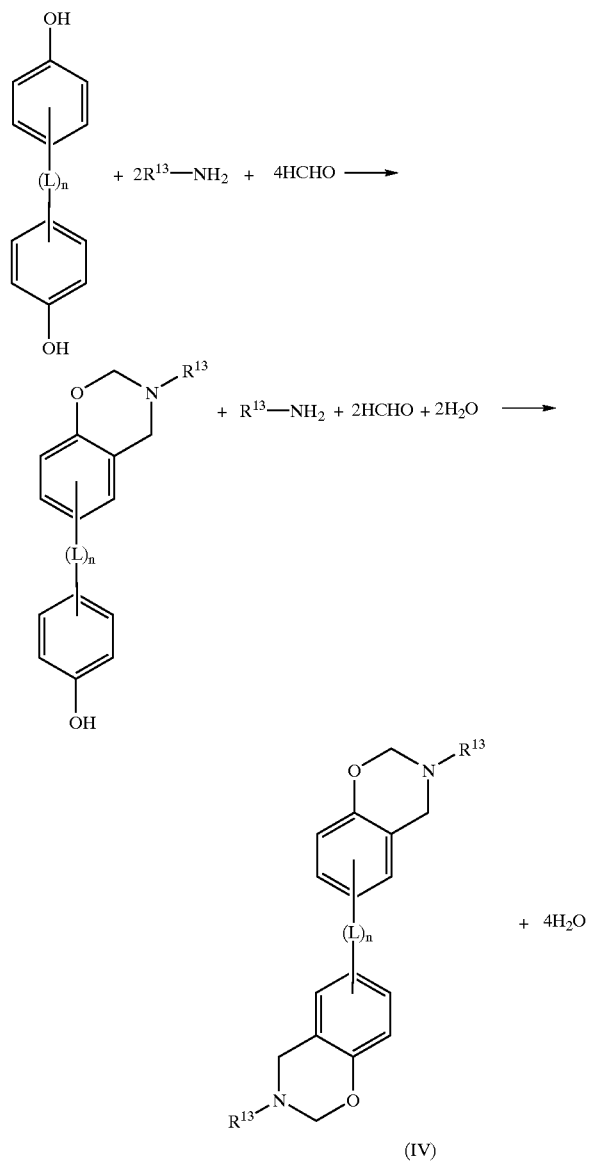

(IV)

wherein $R^{13}$ represents an unsubstituted or substituted phenyl group, a methyl group or a cyclohexyl group; L represents a divalent unsubstituted or substituted aliphatic hydrocarbon residue, a divalent unsubstituted or substituted aromatic hydrocarbon residue, a divalent unsubstituted or substituted heterocyclic compound residue, an oxygen atom, a sulfur atom, and a functional group, such as sulfonyl group or a carbonyl group; and n is 0 or 1.

As shown in U.S. Pat. No. 5,152,939, the above-mentioned compounds having a 3,4-dihydro-3-substituted-1,3-benzoxazine skeleton have thermocurability. That is, these compounds can be cured by heating at an appropriate temperature so as to effect a ring-opening polymerization reaction thereof.

In the present invention, the number average molecular weights of the DSBS compound and the ring-opening polymerization reaction product thereof used as component (b) are preferably in the range of from 200 to 200,000, more preferably from 300 to 150,000, still more preferably from 400 to 100,000, most preferably from 500 to 100,000. When the number average molecular weight of the DSBS compound or the ring-open polymerization reaction product thereof is less than 200, a long period of time is needed for curing the curable PPE resin composition, so that the productivity is dis-advantageouly lowered. On the other hand, when the number average molecular weight of the DSBS compound or the ring-open polymerization reaction product thereof is more than 200,000, as described below, the operability is disadvantageously lowered. As the ring-opening polymerization reaction of the DSBS compound proceeds, the number average molecular weight of the ring-open polymerization reaction product increases, which in turn increases the viscosity of the reaction product. When the number average molecular weight of the DSBS compound or the ring-opening polymerization reaction product thereof exceeds 200,000, the viscosity of the DSBS compound or the ring-opening polymerization reaction product thereof is so high that it is difficult to knead the DSBS compound or the ring-opening polymerization reaction product thereof with the polyphenylene ether resin, so that the operability is disadvantageously lowered. Therefore, in some cases, it is preferred that a part of the DSBS compound is preliminarily polymerized at a temperature of from 50 to 250° C., more advantageously from 80 to 180° C., so that the number average molecular weight of the ring-opening polymerization reaction product is controlled to a level in the range of from more than 200 to 200,000.

The number average molecular weights of the DSBS compound and the ring-opening polymerization reaction product thereof can be determined by a conventional method, such as gel permeation chromatography, the light scattering method or osmometry.

Preferred examples of DSBS compounds and mixtures of the DSBS compound and a ring-opening polymerization reaction product thereof include compounds represented by the following formulae, dimers and oligomers thereof, and mixtures thereof. In the present invention, DSBS compounds can be used individually, or in combination in an appropriate ratio.

In the present invention, when a mixture of a DSBS compound and a ring-opening polymerization reaction product thereof is used as component (b), there is no particular limitation with respect to the ratio of the DSBS compound to the ring-opening polymerization reaction product thereof. However, the amount of the ring-opening polymerization reaction product is generally 5 to 40% by weight, based on the weight of the above-mentioned mixture.

13
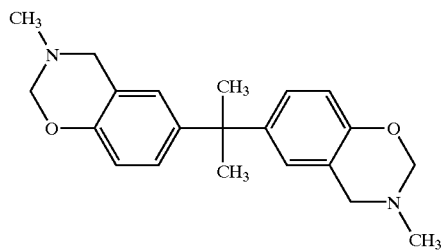
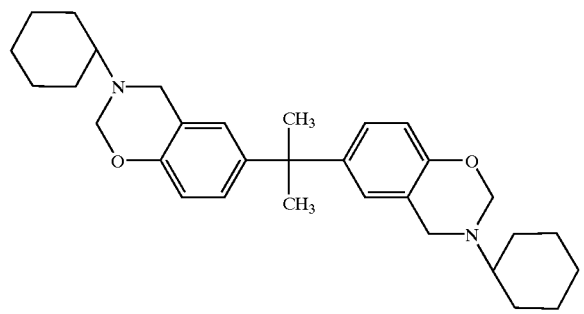
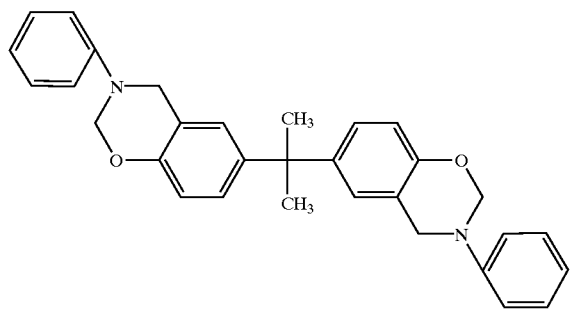
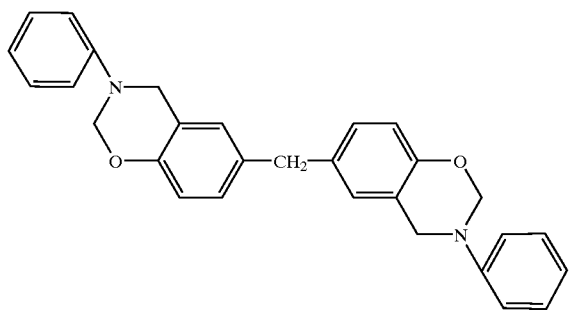
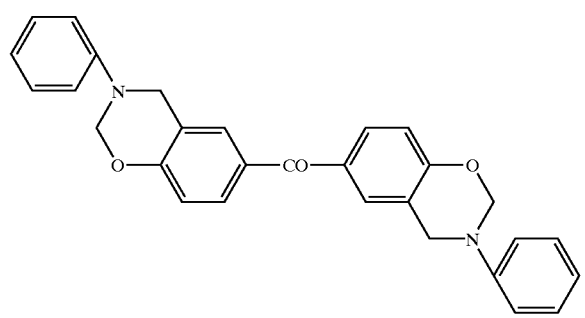
14
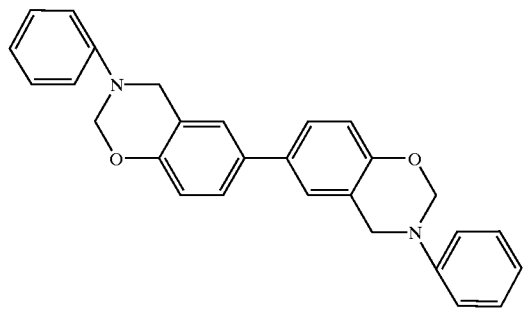
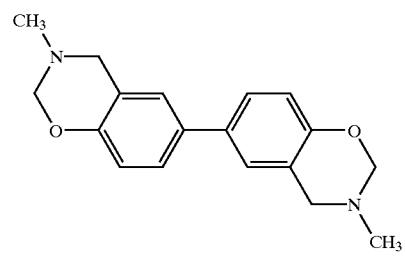
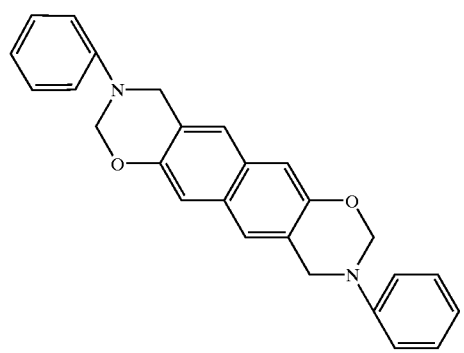
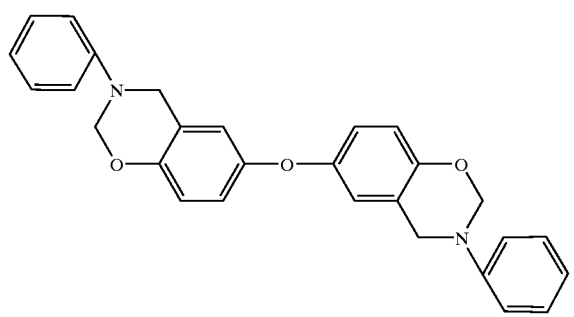
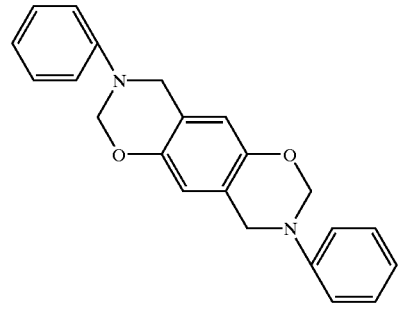

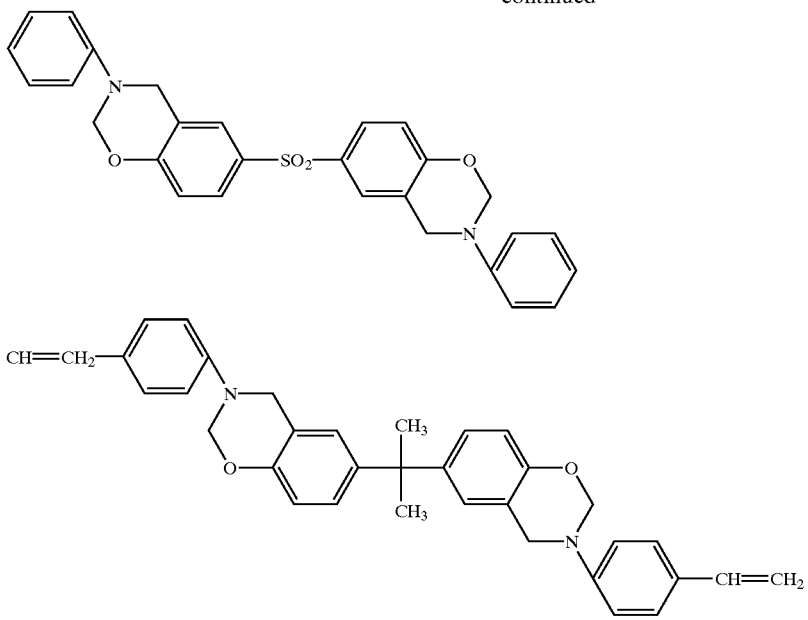

The DSBS compound used in the present invention is in the form of a solid or a high viscosity liquid at room temperature. In either case, when the temperature of the DSBS compound is elevated from room temperature, the state of the compound is changed to the cured state at a temperature in the range of from about 80 to 300° C. through the state of a liquid having a low viscosity. Therefore, by adjusting the temperature of the DSBS compound, the melt-viscosity of the compound and the timing of curing of the compound can be appropriately controlled. Therefore, in the treatment for curing the curable PPE resin composition of the present invention, the DSBS compound effectively functions as a plasticizer or a curing agent. That is, during the period of from the start of heating the compound to before the curing of the resin composition, the compound functions as a plasticizer for improving the fluidity of the resin composition; and during the curing of the resin composition, the compound functions as a curing agent for the resin composition. Therefore, when the treatment for curing the curable PPE resin composition of the present invention is conducted using a press or the like, a desired degree of flowing is achieved with respect to the resin composition before the curing thereof, so that excellent moldability of the resin composition can be achieved.

In the present invention, when it is especially desired to improve the adherability of the curable PPE resin composition to the below-mentioned metallic foil or the below-mentioned metallic substrate, the objective can be attained by incorporating a thermocurable resin (c) into the curable PPE resin composition. In the present invention, there is no particular limitation with respect to thermocurable resins used as component (c). Examples of such thermocurable resins include an epoxy resin, a phenolic novolak and a melamine resin. These resins can be used individually or in combination. However, from the viewpoint of the heat resistance of the curable PPE resin composition and the costs, it is preferred to use an epoxy resin.

With respect to epoxy resins used as component (c), there is no particular limitation as long as they have 2 or more epoxy groups in a molecule thereof. In the present invention, conventional epoxy resins can be used individually or in combination. Representative examples of epoxy resins include a glycidyl ether type epoxy resin obtained by reacting a phenol or an alcohol with epichlorohydrin; a glycidyl ester type epoxy resin obtained by reacting a carboxylic acid with epichlorohydrin; a glycidyl type epoxy resin obtained by reacting an amine or cyanuric acid with epichlorohydrin; and an internal epoxy resin obtained by oxidizing a double bond in an organic compound. With respect to these epoxy resins, reference can be made to, for example, "Epokishi jushi handobukku (Epoxy resin handbook)" edited by Masaki Shimbo (The Nikkan Kogyo Shimbun, Japan, 1987).

The curable resin composition of the present invention comprises the above-mentioned components (a) and (b). With respect to the amounts of components (a) and (b), there is no particular limitation as long as the amounts of components (a) and (b) are, respectively, from 98 to 20 parts by weight and from 2 to 80 parts by weight, relative to 100 parts by weight of the total of components (a) and (b). However, it is preferred that the amounts of components (a) and (b) are, respectively, from 98 to 40 parts by weight and from 2 to 60 parts, more advantageously from 95 to 50 parts by weight and from 5 to 50 parts by weight, relative to 100 parts by weight of the total of components (a) and (b). When the amount of component (b) is less than 2 parts by weight, the chemical resistance of the curable resin composition is unsatisfactory. On the other hand, when the amount of component (b) is more than 80 parts by weight, the dielectric characteristics of the curable resin composition are unsatisfactory (especially, the dielectric constant and dielectric loss tangent of the curable resin composition are high in a high frequency range).

When the curable PPE resin composition of the present invention further comprises component (c) in addition to the above-mentioned components (a) and (b), it is preferred that the total amount of components (a) and (b), and the amount of component (c) are, respectively, from 99 to 1 part by weight and from 1 to 99 parts by weight, more advantageously from 90 to 10 parts by weight and from 10 to 90 parts by weight, still more advantageously from 90 to 50 parts by weight and from 10 to 50 parts by weight, relative to 100 parts by weight of the total of components (a), (b) and (c). When the amount of component (c) is less than 1 part by weight, the improvement in the adherability of the curable PPE resin composition to the below-mentioned metallic foil and the below-mentioned metallic substrate is unsatisfactory. On the other hand, when the amount of component (c) is more than 99 parts by weight, the dielectric characteristics (especially, the dielectric constant and dielectric loss tangent in a high frequency range), the flame retardancy and moisture resistance of the curable PPE resin composition are likely to be disadvantageously lowered. Further, when the amount of component (c) is more than 99 parts by weight, the below-mentioned curable film is likely to be brittle or have surface tack, leading to a lowering of the handling characteristics of the curable PPE resin composition.

Examples of methods for mixing the above-mentioned components include a solution-mixing method in which the components are uniformly dissolved or dispersed in a solvent and mixed; and a melt-blending method in which the components are heated and blended using an extruder or the like. Examples of solvents used in the solution-mixing method include a halogeno solvent, such as dichloromethane, chloroform or trichloroethylene; an aromatic solvent, such as benzene, toluene or xylene; a ketone solvent, such as acetone, methyl ethyl ketone or methyl isobutyl ketone; and an aprotic polar solvent, such as dimethylformamide or dimethyl sulfoxide. These solvents can be used individually or in combination.

The curable PPE resin composition of the present invention can be advantageously used in the form of a film.

As a method for producing a film of the curable PPE resin composition, there can be mentioned a conventional method, such as a casting method. When such a method is employed for producing a film of the curable PPE resin composition, a film having any desired thickness can be produced by adjusting the concentration of the solution used. As solvents for producing a curable film of the curable PPE resin composition, there can be mentioned the same solvents as used for the above-mentioned solution-blending method.

As mentioned below, the curable polyphenylene ether resin composition of the present invention can be cured by a conventional method, such as a heating method or an actinic ray radiation method. For enhancing the cure reactivity of the curable PPE resin composition, a curing agent may be incorporated into the curable PPE resin composition.

Such a curing agent can be chosen depending on the type of component (b) and/or component (c). For example, when the curable resin composition comprises an epoxy resin as component (c), a conventional curing agent for an epoxy resin can be used. Examples of such curing agents include a polyamine type curing agent, an acid anhydride type curing agent, a polyphenol type curing agent, a polymer-captan type curing agent, an anion polymerization catalyst type curing agent, a cation polymerization catalyst type curing agent and a latent curing agent. With respect to the curing agents for epoxy resins, reference can be made to, for example, "Epokishi jushi handobukku (Epoxy resin handbook)" edited by Masaki Shimbo (The Nikkan Kogyo Shimbun, Japan, 1987) and "Nyumon epokishi jushi (Introduction to Epoxy Resins)" written by Soichi Muroi and Shuichi Ishimura (Kobunshi Kankokai (Polymer Publishing Association), Japan, 1988). These curing agents can be used individually or in combination.

In addition to a curing agent, a filler and an additive may be incorporated into the curable polyphenylene ether resin composition of the present invention so as for the resin composition to have additional, desired properties. The filler and additive are used in amounts such that the resin composition is not adversely affected. Examples of fillers include carbon black, silica, alumina, barium titanate, talc, mica, a glass bead, a hollow glass bead and a silicate (e.g., calcium silicate). Examples of additives include an antioxidant, a thermal stabilizer, an antistatic agent, a plasticizer, a pigment, a dye and a colorant. Further, for enhancing the flame retardancy of the resin composition, a flame retardant and an auxiliary flame retardant can be used in combination with other additives. Examples of flame retardants include a chlorine-containing flame retardant, a bromine-containing flame retardant, a phosphorus-containing flame retardant, a metal hydroxide and an organometallic compound. Examples of auxiliary flame retardants include $Sb_2O_3$, $Sb_2O_5$ and $NaSbO_3.1/4H_2O$. Moreover, into the resin composition may be incorporated a crosslinkable monomer, such as allyl glycidyl ether, glycidyl methacrylate or glycidyl acrylate; a thermoplastic resin, such as a polyethylene, a polypropylene, a polybutene, an ethylene/polypropylene copolymer, nylon 4, nylon 6, nylon 6,6, a poly(ethylene terephthalate), a polycarbonate, a polyacetal, a polysulfone, a poly(vinyl chloride) or a polystyrene; a rubber, such as a styrene/butadiene copolymer or a natural rubber. These crosslinkable monomers, thermoplastic resins and rubbers can be used individually or in combination.

The cured polyphenylene ether resin composition of the present invention can be obtained by curing the above-mentioned curable PPE resin composition of the present invention. As a method for curing the curable PPE resin composition, there can be mentioned a method which is generally employed for curing a conventional curable PPE resin composition. The curing of the curable PPE resin composition can be conducted by a conventional method, such as a heating method or an actinic ray radiation method.

When the curing of the curable resin composition is conducted by heating, the heating temperature and heating time vary depending not only on whether or not a curing agent is used, but also on what type of curing agent is used. However, the heating temperature is generally in the range of from 80 to 300° C., preferably from 100 to 280° C., more preferably from 180 to 250° C.; and the heating time is generally in the range of from 1 minute to 10 hours, preferably from 1 minute to 5 hours.

The cured polyphenylene ether resin composition of the present invention can be used in the form of a film. With respect to the method for producing such a film, there is no particular limitation. Examples of methods for producing such a film include a method comprising: forming a film of the curable resin composition using a solution thereof in a solvent by a casting method or the like, and curing the film by a conventional method, such as a heating method or an actinic ray radiation method, thereby obtaining a film of the cured resin composition. It is possible to produce a film having any desired thickness. For example, as a film for use as a substrate for a printed circuit board, there can be produced a film having a thickness of from 1 $\mu$m to 5 mm, preferably from 5 $\mu$m to 1 mm, more preferably from 10 $\mu$m to 1 mm.

A film of the curable PPE resin composition and a film of the cured PPE resin composition, as well as the below-mentioned curable PPE resin composition composite material, can be laminated onto a metallic foil and/or a metallic substrate.

Hereinbelow, an explanation is made with respect to the curable PPE resin composition composite material of the present invention.

The curable PPE resin composition composite material of the present invention comprises the curable PPE resin composition of the present invention and (d) a reinforcement, wherein the reinforcement is incorporated in the curable PPE resin composition. The cured resin composition composite material obtained by curing the curable PPE resin composition composite material has excellent mechanical strength attributed to reinforcement (d).

Examples of reinforcements (d) of the curable resin composition composite material include various glass cloths and glass non-woven cloths, such as glass roving cloth, glass cloth, glass chopped mat and glass surfacing mat; ceramic fiber fabrics, metallic fiber fabrics and other synthetic or natural inorganic fiber fabrics; woven or non-woven fabrics obtained from synthetic fibers, such as poly(vinyl alcohol) fiber, polyester fiber, acrylic fiber and aromatic polyamide fiber; natural woven fabrics, such as cotton cloth, hemp cloth and felt; carbon fiber fabrics; and natural cellulosic fabrics, such as kraft paper, cotton paper and glass fiber-containing paper. These reinforcements can be used individually or in combination.

The amount of reinforcement (d) of the curable PPE resin composition composite material of the present invention is 5 to 90 parts by weight, preferably 10 to 80 parts by weight, more preferably 20 to 70 parts by weight, relative to 100 parts by weight of the curable resin composition composite material, wherein when component (c) is not contained in the curable PPE resin composition composite material, the amount of the curable resin composition composite material means the total amount of components (a), (b) and (d), and when component (c) is contained in the curable PPE resin composition composite material, the amount of the curable resin composition composite material means the total amount of components (a), (b), (c) and (d). When the amount of reinforcement (d) is less than 5 parts by weight, relative to 100 parts by weight of the curable resin composition composite material, the dimensional stability and mechanical strength of the cured resin composition composite material obtained by curing the curable resin composition composite material are unsatisfactory. On the other hand, the amount of the reinforcement (d) is more than 90 parts by weight, relative to 100 parts by weight of the curable resin composition composite material, the dielectric characteristics (especially, dielectric constant and dielectric loss tangent in a high frequency range) and flame retardancy of the cured resin composition composite material obtained by curing the curable resin composition composite material are disadvantageously lowered.

If desired, a coupling agent may be incorporated into the curable PPE resin composition composite material of the present invention for improving the bonding strength at the interface between the resin composition and reinforcement (d). Examples of coupling agents include a silane type coupling agent, a titanate type coupling agent, an aluminum type coupling agent and a zircoaluminate type coupling agent.

With respect to the method for producing the curable PPE resin composition composite material by incorporating reinforcement (d) into the curable PPE resin composition, there is no particular limitation. As an example of such methods, there can be mentioned the following method: components (a) and (b), or components (a), (b) and (c) are uniformly dissolved or dispersed in the above-mentioned solvent, such as a halogeno solvent, an aromatic solvent, a ketone solvent, dimethylformamide or dimethyl sulfoxide, or mixtures thereof, to thereby impregnate the resultant solution or dispersion into reinforcement (d), followed by drying of reinforcement (d). In this method, if desired, components (a) and (b), or components (a), (b) and (c) may be used in combination with other components. The impregnation of the solution or dispersion (containing components (a) and (b), or components (a), (b) and (c)) into reinforcement (d) can be conducted by dipping, coating or the like. The impregnation may be repeated a plurality of times. When the impregnation is repeated a plurality of times, a plurality of solutions or dispersions having different formulations and concentrations may be used for the repeated impregnation, so that a desired amount of the curable PPE resin composition having a desired formulation can be obtained.

The cured resin composition composite material of the present invention is obtained by curing the above-mentioned curable resin composition composite material. The curing is conducted, for example, by heating. With respect to the method for producing the cured resin composition composite material, there is no particular limitation. The cured resin composition composite material can be produced, for example, by the following method. Several sheets of the above-mentioned curable resin composition composite materials are laid one upon another. The sheets are then, under heating and pressure, bonded to each other while effecting thermal curing, to thereby obtain a laminate of sheets of a cured resin composition composite material having a desired thickness. Moreover, it is possible to subject to curing treatment the above-obtained cured resin composition composite material and, combined therewith, another curable resin composition composite material, so that a cured resin composition composite material having a unique layer structure can be produced.

The shaping and thermal curing of a laminate structure are generally simultaneously conducted by using a heat-pressing machine. However, the shaping and thermal curing of a laminate structure may be conducted separately from each other. That is, an uncured or semi-cured, curable resin composition composite material which has been obtained by shaping it into a laminate structure can be cured by a conventional method, such as a heating method or an actinic ray radiation method.

The shaping and thermal curing of the laminate structure of the curable resin composition composite material of the present invention can be achieved by treatment at a temperature of from 80 to 300° C. under a pressure of from 0.1 to 500 kg/cm$^2$ for a period of from 1 minute to 10 hours, preferably at a temperature of from 150 to 250° C. under a pressure of from 1 to 100 kg/cm$^2$ for a period of 1 minute to 5 hours.

Hereinbelow, an explanation is made with respect to the curable laminate structure and the curable composite structure of the present invention.

The curable laminate structure of the present invention is a curable laminate structure comprising a primary metallic foil and at least one curable resin composition layer disposed on at least one surface of the primary metallic foil. The curable resin composition layer comprising the curable polyphenylene ether resin composition of the present invention or the curable polyphenylene ether resin composition composite material of the present invention. When the laminate structure has at least two curable resin composition layers on at least one surface of the primary metallic foil, the at least two curable resin composition layers are the same or different and the at least two curable resin composition layers are disposed one upon another.

The curable composite structure of the present invention is a curable composite structure comprising a metallic substrate and at least one curable resin composition layer disposed on at least one surface of the metallic substrate. The curable resin composition layer comprises the curable polyphenylene ether resin composition of the present invention or the curable polyphenylene ether resin composition composite material of the present invention. When the composite structure has at least two curable resin composition layers on at least one surface of the metallic substrate, the at least two curable resin composition layers are the same or different and the at least two curable resin composition layers are disposed one upon another.

In the present invention, the term "metallic foil" means a metallic thin sheet having a thickness of from 5 $\mu$m to less than 200 $\mu$m. Examples of metallic foils include a copper foil and an aluminum foil. It is preferred that the metallic foil has a thickness of from 5 to 100 $\mu$m.

In the present invention, the term "metallic substrate" means a metallic plate having a thickness of from 0.2 to 10 mm. Examples of metallic substrates include an iron substrate, an aluminum substrate, a silicon steel substrate and a stainless steel substrate. It is preferred that the metallic substrate has a thickness of from 0.2 to 5 mm. For improving the bonding strength of the metallic substrate, the metallic substrate may, prior to use, be preliminary subjected to surface treatment. For example, the surface treatment consists in subjecting the metallic substrate to mechanical abrasion, such as sanding using an abrasive paper or an abrasive cloth, wet blasting, or dry blasting, and subsequently subjecting the resultant mechanically abrased surface to degreasing, etching, anodization, compound film formation treatment or the like. When an aluminum substrate is used, it is preferred that, after abrasion, the aluminum substrate is degreased using sodium carbonate and then etched using sodium hydroxide. However, the surface treatment of an aluminum substrate is not limited to this treatment.

In each of the curable laminate structure and the curable composite structure of the present invention, the thickness of the curable resin composition layer is in the range of from 5 $\mu$m to 100 mm, preferably from 10 $\mu$m to 5 mm, more preferably from 30 $\mu$m to 2 mm.

The curable laminate structure or the curable composite structure of the present invention can be produced, for example, by the following method. Any of the curable polyphenylene ether resin composition and the curable polyphenylene ether resin composition composite material (each of which is hereinafter referred to commonly as "curable polyphenylene ether resin composition") of the present invention are/is provided in the form of a film. The film or films are laminated onto a metallic foil or a metallic substrate in accordance with a predetermined laminate configuration to thereby obtain a laminate structure. Then, the laminate structure is dried to thereby obtain a curable laminate structure or a curable composite structure. As a method for curing the curable laminate structure or curable composite structure thus obtained, there can be mentioned a method in which the interlayer bonding of the layers of the curable laminate structure or the curable composite structure is conducted under heating and pressure while effecting thermal curing of the curable resin composition.

Examples of methods for laminating the curable polyphenylene ether resin composition of the present invention on a metallic foil or a metallic substrate include the above-mentioned method comprising laminating a film of the curable polyphenylene ether resin composition onto a metallic foil or a metallic substrate, and a method comprising coating the curable polyphenylene ether resin composition in the form of a solution on a metallic foil or a metallic substrate, thereby obtaining a laminate structure. When the curable laminate structure and the curable composite structure of the present invention are cured, the curable resin composition layer becomes an insulating layer in the laminate structure and the composite structure.

In the curable laminate structure and the curable composite structure of the present invention, the curable resin composition layer, a metallic foil and a metallic substrate can have any desired laminate configuration.

For example, when the curable laminate structure of the present invention has one curable resin composition layer on at least one surface of the metallic substrate, the curable laminate structure can have an additional metallic foil disposed on the outer surface of the curable resin composition layer. When the curable laminate structure of the present invention has at least two curable resin composition layers on at least one surface of the metallic substrate, the composite structure can have at least one structure selected from the group consisting of a metallic foil-exposed structure wherein there is an additional metallic foil disposed on the outer surface of an outermost curable resin composition layer and a metallic foil-interposed structure wherein there is an additional metallic foil disposed between at least one of the curable resin composition layers and a curable resin composition layer adjacent thereto.

With respect to the curable composite structure of the present invention, when the curable composite structure has one curable resin composition layer on at least one surface of the metallic substrate, the curable composite structure can have a metallic foil disposed on the outer surface of the curable resin composition layer. When the curable composite structure has at least two curable resin composition layers on at least one surface of the metallic substrate, the composite structure can have at least one structure selected from the group consisting of a metallic foil-exposed structure wherein there is a metallic foil disposed on the outer surface of an outermost curable resin composition layer and a metallic foil-interposed structure wherein there is a metallic foil disposed between at least one of the curable resin composition layers and a curable resin composition layer adjacent thereto.

An adhesive may be used for bonding the curable resin composition layer to the metallic foil and the metallic substrate. Examples of adhesives include an epoxy resin adhesive, an acrylic resin adhesive, a phenolic resin composition and a cyanoacrylate adhesive. Adhesives other than the above-mentioned adhesives may also be used. With respect to the shaping and curing of each of the above-mentioned curable laminate structure and the curable composite structure, the shaping and curing can be conducted by substantially the same method as employed for shaping and curing a plurality of layers of the curable resin composition composite materials of the present invention.

The metallic foil/insulating layer laminate structure of the present invention can be obtained by curing the curable laminate structure of the present invention.

The metallic substrate/insulating layer composite structure of the present invention can be obtained by curing the curable composite structure of the present invention.

As examples of methods for producing the metallic foil/insulating layer laminate structure or the metallic substrate/insulating layer composite structure of the present invention, there can be mentioned a method comprising curing the curable laminate structure or the curable composite structure mentioned above; and a method comprising repeating the lamination and curing a plurality of times with respect to the curable resin composition layer and the metallic foils and/or the metallic substrates so as to obtain a multi-layer structure.

The above-mentioned metallic foil/insulating layer laminate structure and the above-mentioned metallic substrate/insulating layer composite structure can be advantageously used in the electrical and electronic industries, the space and aircraft industries and the like. Especially, the above-mentioned metallic foil/insulating layer laminate structure and the above-mentioned metallic substrate/insulating layer composite structure can be advantageously used as substrates for a single-sided printed circuit board, a double-sided printed circuit board, a multi-layer printed circuit board, a flexible printed circuit board and a semi-rigid circuit board, a substrate for a structure having excellent heat removal characteristics, and the like.

BEST MODE FOR CARRYING OUT THE INVENTION

Hereinbelow, the present invention will be described in more detail with reference to the following Examples and Comparative Examples, which should not be construed as limiting the scope of the present invention.

In the Examples and Comparative Examples, the following components were used.
(1) Polyphenylene Ether Resin (a)
① Polymer A
Poly(2,6-dimethyl-1,4-phenylene ether) is used as polymer A. Polymer A has a reduced viscosity (ηsp/C) of 0.56, as measured using a 0.5 g/dl chloroform solution thereof having a temperature of 30° C.
② Polymer B
100 parts by weight of polymer A, 1.5 parts by weight of maleic anhydride, and 1.0 part by weight of 2,5-dimethyl-2,5-di(t-butylperoxy)hexane (Perhexa 25B, manufactured and sold by Nippon Oil & Fats Co., Ltd., Japan) are dry-blended (i.e., blended without using a solvent) at room temperature, and the resultant mixture is then extruded using a twin-screw extruder under conditions wherein the cylinder temperature is 300° C. and the screw revolution speed is 230 rpm, thereby obtaining a polymer. The obtained polymer is used as polymer B.
(2) Compound having a 3,4-dihydro-3-substituted-1,3-benzoxazine skeleton (DSBS compound) (b)
① Compound C
6,6'-(1-methylethylidene)bis(3,4-dihydro-3-phenyl-2H-1,3-benzoxazine) is used as compound C. Compound C has a number average molecular weight of 1,000, as determined by gel permeation chromatography (GPC) using standard polystyrene samples. The synthesis of compound C is performed as follows.
(Synthesis of Compound C)
A 37% aqueous solution of formaldehyde is dropwise added to a dioxane solution of aniline at 10° C. or lower to thereby obtain a mixture. The obtained mixture is stirred at room temperature for 30 minutes, and a solution of bisphenol A in dioxane is dropwise added thereto at room temperature. The resultant mixture is heated under reflux for about 6 hours, and the dioxane as the solvent is removed by distillation, thereby obtaining a distillation residue having a color of light yellow. The obtained residue is dissolved in diethyl ether and then washed with water. From the resultant diethyl ether layer is removed the diethyl ether contained therein by distillation, thereby obtaining compound C. The thus obtained compound C has a number average molecular weight of 1,000, as determined by gel permeation chromatography (GPC) using standard polystyrene samples.
With respect to the amounts of aniline, formaldehyde and bisphenol A used in the above-mentioned synthesis of compound C, the aniline/formaldehyde/bisphenol A molar ratio is 1:2:4.
② Compound D
6,6'-(sulfonyl)bis(3,4-dihydro-3-phenyl-2H-1,3-benzoxazine) is used as compound D. Compound D has a number average molecular weight of 800, as determined by gel permeation chromatography (GPC) using standard polystyrene samples.
Compound D is synthesized by substantially the same method as employed in the above-mentioned synthesis of compound C, except that 4,4'-dihydroxydiphenyl-sulfone is used instead of bisphenol A.
(3) Epoxy Resin (c)
Bisphenol A glycidyl ether epoxy resin (AER331, manufactured and sold by Asahi Kasei Kogyo Kabushiki Kaisha, Japan; epoxy equivalent: 189) is used as epoxy resin (c).
(4) Curing Agent
2-ethyl-4-methylimidazole (manufactured and sold by Wako Pure Chemical Industries, Ltd., Japan) is used as a curing agent.
(5) Flame Retardant
Decabromodiphenylether (AFR1021, manufactured and sold by Asahi Glass Co., Ltd., Japan) is used as flame retardant E, and phosphoric ester (PX-200, manufactured and sold by Daihachi Chemical Industry Co., Ltd., Japan) is used as flame retardant F.
(6) Auxiliary Flame Retardant
$Sb_2O_3$ (PATOX-M, manufactured and sold by NIHON SEIKO CO., LTD., Japan) is used as an auxiliary flame retardant.
(7) Glass Cloth
The following two types of glass cloths, which are manufactured and sold by Asahi Schwebel Co., Ltd., Japan, are used.
① D glass-made Glass Cloth
This glass cloth has the following composition: $SiO_2$ (73.0% by weight); $Al_2O_3$ (1.0% by weight); $B_2O_3$ (3.5% by weight); $Na_2O$ and $K_2O$ (21.0% by weight); and $Fe_2O_3$ (0.1% by weight). The weight per unit area of this glass cloth is 87 g/m².
② E glass-made Glass Cloth
This glass cloth has the following composition: $SiO_2$ (53.8% by weight); $Al_2O_3$ (15.0% by weight); CaO (17.3% by weight); MgO (4.7% by weight); $B_2O_3$ (8.0% by weight); $Na_2O$ and $K_2O$ (0.6% by weight); and $Fe_2O_3$ (0.2% by weight). The weight per unit area of this glass cloth is 105 g/m².

In the Examples and Comparative Examples, cured films and copper foil/insulating layer laminate structures are, respectively, evaluated by the following methods.
<Evaluation of a Cured Film>
Trichloroethylene Resistance
A cured film is boiled in trichloroethylene for 5 minutes. Then, the cured film is visually observed and the appearance of the cured film is evaluated by the following criteria.
○: the cured film has maintained a good appearance.
×: the cured film has suffered swell and warp.
<Evaluation of a Copper Foil/insulating Layer Laminate Structure>
(1) Trichloroethylene Resistance
A copper foil/insulating layer laminate structure is immersed in an HCl solution of $FeCl_3$ (ferric chloride liquid, manufactured and sold by TSURUMI SODA CO., LTD., Japan; $FeCl_3$ content: 37 to 39% by weight) having a temperature of 60° C. to remove the copper foil from the laminate structure. From the copper foil-removed laminate structure obtained is cut out a sample having a size of 25 mm×25 mm. The sample is boiled in 200 ml of trichloroethylene for 5 minutes. Then, the sample is visually observed and the appearance of the sample is evaluated by the following criteria.

○: the sample has maintained a good appearance.

×: the surface of the sample has suffered chalking and the glass cloth of the sample has been caused to be exposed.

(2) Dielectric Constant and Dielectric Loss Tangent

Using a LF impedance analyzer (HP-4192, manufactured and sold by Yokokawa-Hewlett-Packard, Ltd., Japan), the dielectric constant and dielectric loss tangent of a copper foil/insulating layer laminate structure are measured at 1 MHz.

(3) Resistance to Soldering Heat

A copper foil/insulating layer laminate structure is immersed in an HCl solution of $FeCl_3$ (ferric chloride liquid, manufactured and sold by TSURUMI SODA CO., LTD., Japan; $FeCl_3$ content: 37 to 39% by weight) having a temperature of 60° C. to thereby remove the copper foil from the laminate structure. From the copper foil-removed laminate structure obtained is cut out a sample having a size of 25 mm×25 mm. The sample is floated on a solder bath having a temperature of 260° C. for 120 seconds. Then, the sample is visually observed and the appearance of the sample is evaluated by the following criteria.

○: the appearance of the sample has not changed.

×: the copper foil of the sample has suffered blister and delamination.

(4) Peeling Strength of Copper Foil

From a copper foil/insulating layer laminate structure is cut out a test sample having a width of 20 mm and a length of 100 mm. On the surface of the copper foil of the sample are cut in a longitudinal direction a pair of parallel nicks extending at an interval of 10 mm therebetween. Then, using a tensile machine, a copper foil band having a width of 10 mm is upwardly, vertically pulled at an end thereof so as to be peeled off from the test sample at a rate of 50 mm/min continuously while measuring the stress of the sample. The measurement is conducted several times, and the minimum of the measured values is defined as the peeling strength of copper foil of the laminate structure.

(5) Hygroscopicity

A copper foil/insulating layer laminate structure is immersed in an HCl solution of $FeCl_3$ (ferric chloride liquid, manufactured and sold by TSURUMI SODA CO., LTD., Japan; $FeCl_3$ content: 37 to 39% by weight) having a temperature of 60° C. to thereby remove the copper foil from the laminate structure. From the copper foil-removed laminate structure obtained is cut out a sample having a size of 25 mm×25 mm. The sample is allowed to stand at an RH of 100% at 121° C. under 2 atm for 500 hours. The weight difference of the sample before and after the 500 hours is defined as the hygroscopicity of the laminate structure.

(6) Dimensional Contraction

From a copper foil/insulating layer laminate structure is cut out a sample having a width of 500 mm and a length of 1,000 mm. The sample is immersed in an HCl solution of $FeCl_3$ (ferric chloride liquid, manufactured and sold by TSURUMI SODA CO., LTD., Japan; $FeCl_3$ content: 37 to 39% by weight) having a temperature of 60° C. for 15 minutes or more to thereby remove the copper foil from the laminate structure. The dimensional change of the sample in the longitudinal direction before and after the removal of the copper foil from the laminate structure is defined as the dimensional contraction of the laminate structure.

(7) Flame Retardancy

A copper foil/insulating layer laminate structure is immersed in an HCl solution of $FeCl_3$ (ferric chloride liquid, manufactured and sold by TSURUMI SODA CO., LTD., Japan; $FeCl_3$ content: 37 to 39% by weight) having a temperature of 60° C. to thereby remove the copper foil from the laminate structure. From the copper foil-removed laminate structure obtained is cut out a sample having a length of 127 mm and a width of 12.7 mm. The flame retardancy of the sample is measured in accordance with the UL-94 test.

EXAMPLES 1 to 8

Provided was a composition comprising: polyphenylene ether resin (a), compound having a 3,4-dihydro-3-substituted-1,3-benzoxazine skeleton (DSBS compound) (b), and optionally epoxy resin (c), a curing agent, a flame retardant, and/or an auxiliary flame retardant, wherein components (a), (b) and (c), the curing agent, the flame retardant and the auxiliary flame retardant were used in amounts shown in Table 1. Each composition was individually dissolved in 100 parts by weight of dimethylformamide, wherein the total amount of components (a), (b) and (c) was 100 parts by weight. The resultant solution was then applied onto a Teflon plate to thereby form a coating on the Teflon plate at room temperature. The coating was then peeled off from the Teflon plate to thereby obtain a film having a thickness of about 100 μm. In each of Examples 1 to 8, the composition had the capability of forming a good film. Any of the films formed in Examples 1 to 8 had no surface tack or the like.

The films obtained above were dried for a period of from 30 minutes to 1 hour using an air oven (60° C.). Then, a plurality of the films were laid one upon another, and shaped and cured using a vacuum press to thereby obtain a cured film having a thickness of about 1 mm. The curing conditions were as follows: when compound C was used as the DSBS compound, the curing was conducted at 240° C. under atmospheric pressure for 1 hour; and when compound D was used as the DSBS compound, the curing was conducted at 220° C. under atmospheric pressure for 1 hour.

The trichloroethylene resistance of the cured film obtained above was evaluated in accordance with the above-mentioned method. The result of the evaluation is shown in Table 1. With respect to each of the cured films obtained in Examples 1 to 8, no change in appearance was observed.

Comparative Examples 1 to 4

A cured film was produced in substantially the same manner as in Examples 1, 2, 6 and 7, except that, instead of DSBS compound (b), epoxy resin (c) was used in the same amount as used with respect to DSBS compound (b) in Examples 1, 2, 6 and 7 and that the curing was conducted at 200° C. for 1 hour.

The trichloroethylene resistance of the cured film obtained above was evaluated by the above-mentioned method. The result of the evaluation is shown in Table 1. With respect to each of the cured films obtained in Comparative Examples 1 to 4, marked swell and warp were observed.

TABLE 1

Amounts of components of curable resin composition[1)]

| | Polyphenylene ether resin (a) | | DSBS Compound (b) | | Epoxy resin | Curing agent | Flame retardant | | Auxiliary flame retardant | Curing Conditions | | Trichloroethylene resistance of cured film |
|---|---|---|---|---|---|---|---|---|---|---|---|---|
| | Polymer A | Polymer B | Compound C | Compound D | (c) | | E | F | | Temperature (°C.) | Time (hr) | |
| Example 1 | 30 | — | 70 | — | — | — | — | — | — | 240 | 1 | o |
| Example 2 | 40 | — | 60 | — | — | — | — | 10 | — | 240 | 1 | o |
| Example 3 | 40 | — | — | 60 | — | — | — | 10 | — | 220 | 1 | o |
| Example 4 | 50 | — | 40 | — | 10 | 1 | 5 | — | 1 | 240 | 1 | o |
| Example 5 | — | 65 | 35 | — | — | — | 5 | — | 1 | 240 | 1 | o |
| Example 6 | — | 50 | 50 | — | — | — | — | 20 | — | 240 | 1 | o |
| Example 7 | — | 65 | — | 35 | — | — | 5 | — | 1 | 220 | 1 | o |
| Example 8 | — | 50 | — | 50 | — | — | — | 10 | — | 220 | 1 | o |
| Comparative Example 1 | 30 | — | — | — | 70 | 2 | — | — | — | 200 | 1 | x |
| Comparative Example 2 | 40 | — | — | — | 60 | 2 | — | 10 | — | 200 | 1 | x |
| Comparative Example 3 | — | 50 | — | — | 50 | — | — | 20 | — | 200 | 1 | x |
| Comparative Example 4 | — | 65 | — | — | 35 | 2 | 5 | — | 1 | 200 | 1 | x |

Note 1
The amount of each component of a curable resin composition is indicated in terms of parts by weight, relative to 100 parts by weight of the total of components (a), (b) and (c).

EXAMPLES 9 to 16

The components shown in Table 2 were dissolved or dispersed (in amounts shown in Table 2) in 100 parts by weight of toluene, relative to 100 parts by weight of the total of components (a), (b) and (c). In the resultant solution or dispersion was immersed a glass cloth to thereby impregnate the glass cloth with the solution or dispersion. The impregnated glass cloth was then dried for 1 hour using an air oven (50° C.) to thereby obtain curable polyphenylene ether resin composition composite materials. (In each of Examples 9 to 16, a plurality of curable polyphenylene ether resin composition composite materials were obtained.) Any of the curable resin composition composite materials obtained in Examples 9 to 16 had no surface tack. All of the curable resin composite materials obtained in Examples 9 to 16 had excellent handling characteristics.

Next, in each of Examples 9 to 16, a plurality of the above-obtained curable resin composition composite materials were laid one upon another so that the thickness of the plurality of the materials after curing became about 0.8 mm, thereby obtaining a plurality of layers of curable resin composition composite materials. Then, two copper foils each having a thickness of 35 μm were, respectively, disposed on the outer surfaces of both outermost layers of the plurality of the layers of curable resin composition composite materials, followed by shaping and curing by means of a pressing machine to thereby obtain a copper foil/insulating layer laminate structure. The curing conditions in Examples 9 to 16 are shown in Table 3. The pressure was 40 kg/cm² in each of Examples 9 to 16. In each of Examples 9 to 16, the resin flow of the curable resin compositions during the pressing was excellent.

Various properties of the obtained laminate structure were evaluated by the above-mentioned methods. The results of the evaluations are shown in Table 3. Table 3 shows that all of the laminate structures of Examples 9 to 16 exhibited various good properties.

Comparative Examples 5 to 8

A copper foil/insulating layer laminate structure was produced in substantially the same manner as in Examples 9, 10, 14 and 15, except that, instead of DSBS compound (b), epoxy resin (c) was used in the same amount as used with respect to DSBS compound (b) in Examples 9, 10, 14 and 15.

Various properties of the obtained laminate structure were evaluated by the above-mentioned methods. The results of the evaluations are shown in Table 3. With respect to all of the laminate structures obtained in Comparative Examples 5 to 8, marked surface chalking and glass cloth exposure were observed. Thus, all of the laminate structures obtained in Comparative Examples 5 to 8 had poor trichloromethylene resistance.

EXAMPLE 17

Three sheets of substantially the same curable polyphenylene ether resin composition composite materials as obtained in Example 14 were laid one upon another on a 1.0 mm-thick aluminum substrate which had been subjected to abrasion, degreasing and etching, thereby obtaining a laminate comprising the aluminum substrate and three layers of the curable polyphenylene ether resin composition composite materials. The obtained laminate was subjected to press molding at 240° C. under 40 kg/cm² for 1 hour to thereby obtain an aluminum substrate/insulating layer composite structure wherein the insulating layer made of cured resin composition composite materials had a thickness of 0.5 mm. The thermal resistance value of the aluminum substrate/insulating layer composite structure was obtained as follows. From the composite structure was cut out a sample having a size of 35 mm×50 mm. A circuit was formed on the sample and a chip resistor having an electric resistance of 100 Ω was connected to the circuit by soldering. The thermal resistance value of the composite structure was obtained by measuring an increase in the temperature of the sample after electric voltage was applied to the circuit.

The composite structure had a thermal resistance value of 24° C./W. By contrast, a composite structure in which an aluminum substrate was not used had a thermal resistance value of 60° C./W. Therefore, the aluminum substrate/insulating layer composite structure had excellent heat removal characteristics, as compared to a composite structure in which an aluminum substrate was not used.

EXAMPLE 18

Three sheets of substantially the same curable polyphenylene ether resin composition composite materials as obtained in Example 16, and a copper foil having a thickness of 35 μm were laid one upon another on a 1.0 mm-thick aluminum substrate which had been subjected to abrasion, degreasing and etching, thereby obtaining a laminate comprising the aluminum substrate, three layers of the curable polyphenylene ether resin composition composite materials, and the copper foil. The obtained laminate was subject to press molding at 220° C. under 40 kg/cm² for 1 hour to thereby obtain an aluminum substrate/insulating layer composite structure wherein the insulating layer made of cured resin composition composite materials had a thickness of 0.5 mm. The thermal resistance value of the aluminum substrate/insulating layer composite structure was obtained by substantially the same method as employed in Example 17. The composite structure had a thermal resistance value of 24° C./W and, hence, had excellent heat removal characteristics.

TABLE 2

| | Amount of components of composition[1] | | | | | | | | | |
|---|---|---|---|---|---|---|---|---|---|---|
| | Polyphenylene ether resin compound (a) | | DSBS compound (b) | | | | Flame retardant | Auxiliary flame retardant | Glass cloth | |
| | Polymer A | Polymer B | Compound C | Compound D | Epoxy resin (c) | Curing agent | E | F | Type | Amount[2] |
| Example 9 | 30 | — | 70 | — | — | — | — | — | — | D glass | 50 |
| Example 10 | 40 | — | 60 | — | — | — | — | — | — | E glass | 50 |
| Example 11 | 40 | — | — | 60 | — | — | — | — | — | E glass | 50 |
| Example 12 | 50 | — | 40 | — | 10 | 1 | 5 | — | 1 | E glass | 50 |
| Example 13 | — | 65 | 35 | — | — | — | 5 | — | 1 | E glass | 50 |
| Example 14 | — | 50 | 50 | — | — | — | — | 20 | — | E glass | 40 |
| Example 15 | — | 65 | — | 35 | — | — | 5 | — | 1 | E glass | 50 |
| Example 16 | — | 50 | — | 50 | — | — | — | 10 | — | E glass | 50 |
| Comparative Example 5 | 30 | — | — | — | 70 | 2 | — | — | — | D glass | 50 |
| Comparative Example 6 | 40 | — | — | — | 60 | 2 | — | 10 | — | E glass | 50 |
| Comparative Example 7 | — | 50 | — | — | 50 | — | — | 20 | — | E glass | 40 |
| Comparative Example 8 | — | 65 | — | — | 35 | 2 | 5 | — | 1 | E glass | 50 |

Note 1
The amount of each component of a curable resin composition is indicated in terms of parts by weight, relative to 100 parts by weight of the total of components (a), (b) and (c).
Note 2
The amount of a glass cloth is indicated in terms of parts by weight, relative to 100 parts by weight of the curable composite material.

TABLE 3

| | Evaluation of laminate structure | | | | | | | | |
|---|---|---|---|---|---|---|---|---|---|
| | Curing conditions | | Trichloroethylene resistance | Dielectric constant | Dielectric loss tangent | Resistance to soldering heat | Peeling strength of copper foil (kg/cm) | Hygroscopicity (%) | Dimensional contraction (%) | Flame retardancy (UL-94) |
| | Temperature (° C.) | Time (hr) | | | | | | | | |
| Example 9 | 240 | 1 | ○ | 3.4 | 0.002 | ○ | 2.1 | 0.2 | 0.02 | V-0 |
| Example 10 | 240 | 1 | ○ | 3.6 | 0.002 | ○ | 2.1 | 0.15 | 0.02 | V-0 |
| Example 11 | 220 | 1 | ○ | 3.7 | 0.003 | ○ | 1.7 | 0.3 | 0.02 | V-0 |
| Example 12 | 240 | 1 | ○ | 3.7 | 0.003 | ○ | 1.8 | 0.3 | 0.03 | V-0 |
| Example 13 | 240 | 1 | ○ | 3.5 | 0.002 | ○ | 1.9 | 0.15 | 0.02 | V-0 |
| Example 14 | 240 | 1 | ○ | 3.7 | 0.003 | ○ | 2.1 | 0.2 | 0.02 | V-0 |
| Example 15 | 220 | 1 | ○ | 3.5 | 0.003 | ○ | 1.5 | 0.15 | 0.02 | V-0 |
| Example 16 | 220 | 1 | ○ | 3.6 | 0.003 | ○ | 1.5 | 0.3 | 0.02 | V-0 |
| Comparative Example 5 | 200 | 1 | x | 4.3 | 0.01 | ○ | 1.8 | 0.5 | 0.1 | V-2 |
| Comparative Example 6 | 200 | 1 | x | 4.2 | 0.01 | ○ | 1.8 | 0.4 | 0.1 | V-2 |

TABLE 3-continued

| | Evaluation of laminate structure | | | | | | | | |
|---|---|---|---|---|---|---|---|---|---|
| | Curing conditions | | Trichloro- ethyl- ene re- sistance | Di- elec- tric con- stant | Dielec- tric loss tangent | Resis- tance to sol- dering heat | Peeling strength of cop- per foil (kg/cm) | Hygro- scopic- ity (%) | Dimen- sional con- trac- tion (%) | Flame retar- dancy (UL-94) |
| | Temper- ature (° C.) | Time (hr) | | | | | | | | |
| Comparative Example 7 | 200 | 1 | x | 4 | 0.01 | ○ | 1.8 | 0.4 | 0.1 | V-1 |
| Comparative Example 8 | 200 | 1 | x | 4.1 | 0.01 | ○ | 1.8 | 0.3 | 0.1 | V-2 |

INDUSTRIAL APPLICABILITY

The curable polyphenylene ether resin composition of the present invention exhibits, after cured, excellent chemical resistance, moisture resistance, dielectric characteristics, heat resistance, flame retardancy and dimensional stability, so that the curable polyphenylene ether resin composition can be advantageously used as a dielectric material, an insulating material, a heat resistant material and the like in the electrical and electronic industries, and also in the space and aircraft industries. Especially, the curable polyphenylene ether resin composition can be advantageously used as a resin composition for forming insulating layers, such as substrates for a single-sided printed circuit board, a double-sided printed circuit board, a multi-layer printed circuit board, a flexible printed circuit board, and a semi-rigid circuit board, and a substrate for a structure having excellent heat removal characteristics.

What is claimed is:

1. A curable polyphenylene ether resin composition comprising:
   (a) a polyphenylene ether resin; and
   (b) a compound having a 3,4-dihydro-3-substituted-1,3-benzoxazine skeleton (DSBS compound), or a mixture of said DSBS compound and a ring-opening polymerization reaction product thereof, and
   wherein the amounts of said polyphenylene ether resin (a) and said component (b) are, respectively, from 98 to 20 parts by weight and from 2 to 80 parts by weight, relative to 100 parts by weight of the total of said components (a) and (b).

2. The curable polyphenylene ether resin composition according to claim 1, which further comprises a thermocurable resin (c) other than said components (a) and (b), and wherein the total amount of said components (a) and (b) and the amount of said thermocurable resin (c) are, respectively, from 99 to 1 parts by weight and from 1 to 99 parts by weight, relative to 100 parts by weight of the total of said components (a), (b) and (c).

3. The curable polyphenylene ether resin composition according to claim 1 or 2, which is a film.

4. A cured polyphenylene ether resin composition obtainable by curing the curable polyphenylene ether resin composition of claim 1 or 2.

5. The cured polyphenylene ether resin composition according to claim 4, which is a film.

6. A curable polyphenylene ether resin composition composite material comprising:
   the curable polyphenylene ether resin composition of claim 1; and
   (d) a reinforcement incorporated in said resin composition, and
   wherein the total amount of said components (a) and (b) and the amount of said component (d) are, respectively, from 95 to 10 parts by weight and from 5 to 90 parts by weight, relative to 100 parts by weight of the total of said components (a), (b) and (d).

7. The curable polyphenylene ether resin composition composite material according to claim 6, wherein said curable polyphenylene ether resin composition further comprises a thermocurable resin (c) other than said components (a) and (b), and
   wherein the total amount of said components (a) and (b) and the amount of said thermocurable resin (c) are, respectively, from 99 to 1 parts by weight and from 1 to 99 parts by weight, relative to 100 parts by weight of the total of said components (a), (b) and (c), and
   wherein the total amount of said components (a), (b) and (c) and the amount of said component (d) are, respectively, from 95 to 10 parts by weight and from 5 to 90 parts by weight, relative to 100 parts by weight of the total of said components (a), (b), (c) and (d).

8. A cured polyphenylene ether resin composition composite material obtainable by curing the curable polyphenylene ether resin composition composite material of claim 6 or 7.

9. A curable laminate structure comprising a primary metallic foil and at least one curable resin composition layer disposed on at least one surface of said primary metallic foil,
   said curable resin composition layer comprising the curable polyphenylene ether resin composition of claim 1 or 2 or the curable polyphenylene ether resin composition composite material of claim 6 or 7, with the proviso that when the laminate structure has at least two curable resin composition layers on at least one surface of said primary metallic foil, said at least two curable resin composition layers are the same or different and said at least two curable resin composition layers are disposed one upon another.

10. A metallic foil/insulating layer laminate structure obtainable by curing the curable laminate structure of claim 9.

11. The curable laminate structure according to claim 9, having an additional metallic foil disposed on the outer surface of the curable resin composition layer when the laminate structure has one curable resin composition layer on at least one surface of said primary metallic foil, and wherein, when the laminate structure has at least two curable resin composition layers on at least one surface of said primary metallic foil, said laminate structure has at least one structure selected from the group consisting of a metallic foil-exposed structure wherein there is an additional metallic foil disposed on the outer surface of an outermost curable resin composition layer and a metallic foil-interposed structure wherein there is an additional metallic foil disposed between at least one of the curable resin composition layers and a curable resin composition layer adjacent thereto.

12. A metallic foil/insulating layer material laminate structure obtainable by curing the curable laminate structure of claim 11.

13. A curable composite structure comprising a metallic substrate and at least one curable resin composition layer disposed on at least one surface of said metallic substrate, said curable resin composition layer comprising the curable polyphenylene ether resin composition of claim 1 or 2 or the curable polyphenylene ether resin composition composite material of claim 6 or 7, with the proviso that when the composite structure has at least two curable resin composition layers on at least one surface of said metallic substrate, said at least two curable resin composition layers are the same or different and said at least two curable resin composition layers are disposed one upon another.

14. A metallic substrate/insulating layer composite structure obtainable by curing the curable composite structure of claim 13.

15. The curable composite structure according to claim 13, having a metallic foil disposed on the outer surface of the curable resin composition layer when the composite structure has one curable resin composition layer on at least one surface of said metallic substrate, and wherein, when the composite structure has at least two curable resin composition layers on at least one surface of said metallic substrate, said composite structure has at least one structure selected from the group consisting of a metallic foil-exposed structure wherein there is a metallic foil disposed on the outer surface of an outermost curable resin composition layer and a metallic foil-interposed structure wherein there is a metallic foil disposed between at least one of the curable resin composition layers and a curable resin composition layer adjacent thereto.

16. A metallic substrate/insulating layer composite structure obtainable by curing the curable composite structure of claim 15.

* * * * *